United States Patent
Yan et al.

(10) Patent No.: US 10,170,298 B2
(45) Date of Patent: Jan. 1, 2019

(54) HIGH TEMPERATURE SILICON OXIDE ATOMIC LAYER DEPOSITION TECHNOLOGY

(71) Applicant: Applied Materials, Inc., Santa Clara, CA (US)

(72) Inventors: Wenbo Yan, Sunnyvale, CA (US); Cong Trinh, Santa Clara, CA (US); Ning Li, San Jose, CA (US); Victor Nguyen, Novato, CA (US); Mihaela Balseanu, Sunnyvale, CA (US); Li-Qun Xia, Cupertino, CA (US); Mark Saly, Santa Clara, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/805,831

(22) Filed: Nov. 7, 2017

(65) Prior Publication Data
US 2018/0076023 A1 Mar. 15, 2018

Related U.S. Application Data

(63) Continuation of application No. 14/872,775, filed on Oct. 1, 2015, now Pat. No. 9,875,888.

(60) Provisional application No. 62/059,615, filed on Oct. 3, 2014.

(51) Int. Cl.
| | |
|---|---|
| *H01L 21/02* | (2006.01) |
| *C23C 16/40* | (2006.01) |
| *C23C 16/455* | (2006.01) |
| *H01L 21/687* | (2006.01) |

(52) U.S. Cl.
CPC ...... *H01L 21/02164* (2013.01); *C23C 16/402* (2013.01); *C23C 16/45542* (2013.01); *C23C 16/45551* (2013.01); *C23C 16/45553* (2013.01); *H01L 21/0228* (2013.01); *H01L 21/0234* (2013.01); *H01L 21/02219* (2013.01); *H01L 21/02274* (2013.01); *H01L 21/02348* (2013.01); *G05B 2219/45031* (2013.01); *G05B 2219/45232* (2013.01); *H01L 21/68764* (2013.01)

(58) Field of Classification Search
CPC .......... H01L 21/02164; H01L 21/0228; H01L 21/02219; H01L 21/0234; H01L 21/02274; H01L 21/02348; C23C 16/45553; C23C 16/45551; C23C 16/45542; C23C 16/402
See application file for complete search history.

(56) References Cited

U.S. PATENT DOCUMENTS

| | | | | |
|---|---|---|---|---|
| 7,473,655 B2* | 1/2009 | Wang | ................... | C23C 16/345 257/E21.293 |
| 7,629,227 B1* | 12/2009 | Wang | ................ | H01L 21/76224 257/E21.559 |
| 7,713,346 B2* | 5/2010 | Wang | ................... | C07F 7/025 106/287.11 |
| 7,786,320 B2* | 8/2010 | Wang | ................... | C07F 7/025 556/410 |
| 8,043,907 B2* | 10/2011 | Ma | ................... | H01L 21/28273 257/E21.179 |

(Continued)

OTHER PUBLICATIONS

Final Rejection of U.S. Appl. No. 14/872,775 dated Mar. 8, 2017; pp. 1-23. (Year: 2017).*

*Primary Examiner* — John P. Dulka
(74) *Attorney, Agent, or Firm* — Servilla Whitney LLC

(57) ABSTRACT

Processes for depositing SiO₂ films on a wafer surface utilizing an aminosilane compound as a silicon precursor are described.

16 Claims, 8 Drawing Sheets

(56) References Cited

U.S. PATENT DOCUMENTS

| | | | | |
|---|---|---|---|---|
| 8,460,753 B2* | 6/2013 | Xiao | ................... | C23C 16/401 |
| | | | | 117/84 |
| 8,771,807 B2* | 7/2014 | Xiao | ................... | C07F 7/025 |
| | | | | 427/578 |
| 8,828,866 B1* | 9/2014 | Wei | ................... | H01L 21/76856 |
| | | | | 257/E21.584 |
| 2004/0010158 A1* | 1/2004 | Meiere | ................... | C07F 17/02 |
| | | | | 556/136 |
| 2004/0018694 A1* | 1/2004 | Lee | ................... | C23C 16/402 |
| | | | | 438/400 |
| 2004/0058293 A1* | 3/2004 | Nguyen | ................... | C23C 16/45525 |
| | | | | 432/129 |
| 2005/0048204 A1* | 3/2005 | Dussarrat | ................... | C23C 16/308 |
| | | | | 427/248.1 |
| 2007/0215036 A1* | 9/2007 | Park | ................... | C23C 16/45551 |
| | | | | 117/88 |
| 2009/0069588 A1* | 3/2009 | Xiao | ................... | C07F 7/025 |
| | | | | 556/412 |
| 2009/0075490 A1* | 3/2009 | Dussarrat | ................... | H01L 21/02164 |
| | | | | 438/787 |
| 2010/0291321 A1* | 11/2010 | Mallikarjunan | ................... | C23C 16/36 |
| | | | | 427/579 |
| 2011/0121430 A1* | 5/2011 | Zagwijn | ................... | H01L 21/02164 |
| | | | | 257/618 |
| 2012/0214006 A1* | 8/2012 | Chen | ................... | C08G 77/62 |
| | | | | 428/447 |
| 2013/0078392 A1* | 3/2013 | Xiao | ................... | C07F 7/025 |
| | | | | 427/579 |
| 2013/0295779 A1* | 11/2013 | Chandra | ................... | C23C 16/402 |
| | | | | 438/790 |
| 2013/0319290 A1* | 12/2013 | Xiao | ................... | H01L 21/02211 |
| | | | | 106/287.11 |
| 2016/0020092 A1* | 1/2016 | Kang | ................... | H01L 21/02274 |
| | | | | 438/761 |

* cited by examiner

HIGH TEMPERATURE SILICON OXIDE ATOMIC LAYER DEPOSITION TECHNOLOGY

CROSS-REFERENCE TO RELATED APPLICATIONS

This application is a continuation of U.S. patent application Ser. No. 14/872,775, filed Oct. 1, 2015, which claims priority to U.S. Provisional Application No. 62/059,615, filed Oct. 3, 2014, the entire disclosure of which is hereby incorporated by reference herein.

FIELD

Embodiments of the present disclosure generally relate to depositing a $SiO_2$ film by atomic layer deposition (ALD). More particularly, the disclosure relates to a process for forming a highly stable $SiO_2$ film on a silicon wafer utilizing aminosilane compounds as the silicon precursor.

BACKGROUND

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming layers conformally onto the surface of a high aspect ratio feature with a dimension of 65 nm or smaller, it may be necessary to use an ALD process. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules onto a substrate surface.

Film layers greater than one monolayer may be achieved by cyclically alternating the pulsing of appropriate reactive precursors into a deposition chamber. Each exposure of the deposition surface to a reactive precursor may be separated spatially and/or temporally by an inert gas purge and/or vacuum. The sequential exposure of a surface to the ALD precursor and reactant may add a new atomic layer to previously deposited layers to form a uniform material layer on the surface of a substrate. Cycles of reactive precursor(s) and inert purge gas(es) are repeated to form a material layer with a predetermined thickness.

Forming high-quality, stable dielectric layers of $SiO_2$ has involved thermal reactions directly utilizing the silicon of the substrate, and CVD depositions utilizing various precursors, such as silane or dichlorosilane, and an oxygen source, for example $N_2O$ or $O_2$, or reaction of tetraethyl orthosilicate (TEOS). These thermal and CVD depositions tend to require higher temperatures that are not necessarily suitable for depositions on substrates that have undergone previous processing, or have progressed to back-end-of-line (BEOL) processes. Films having smaller thicknesses are also difficult to produce by these methods.

In addition, few silicon related ALD precursors are stable at temperatures used for a high temperature (>650 C) deposition processes. The precursors tend to decompose at high temperature instead of forming a self-limited monolayer, resulting in poor film quality. Therefore, there is a need in the art for processes and precursors to form thin, high-quality, stable dielectric layers of $SiO_2$ at temperatures below those typically utilized for thermal or CVD film growth yet having superior properties would therefore be advantageous.

SUMMARY

One or more embodiments of the disclosure are directed to methods of depositing a film. A wafer having a surface is positioned within a reaction chamber. The wafer is heated to a predetermined temperature within the reaction chamber. At least a portion of the wafer is exposed to a silicon precursor for a predetermined period of time to form a silicon layer on the wafer. The silicon precursor comprises a compound with the general formula $R_3Si:NY_3$, wherein each R is independently selected from hydrogen, a halide selected from the group consisting of Cl, Br and I, a linear or branched C1-C10 alkyl group, a linear or branched C1-C10 alkoxy group, and a C6-C10 aryl group, and each Y is independently a hydrogen, a halide selected from the group consisting of Cl, Br and I, a linear or branched C1-C10 alkyl group, a linear or branched C1-C10 alkylsilyl group, and/or a C6-C10 aryl group. At least a portion of the wafer surface is exposed to an oxygen plasma and/or an oxygen source gas to react with the silicon layer on the wafer to form a silicon oxide film.

Additional embodiments of the disclosure are directed to methods of depositing an $SiO_2$ film on a wafer. The wafer surface is exposed to a silicon precursor, wherein the silicon precursor comprises $R_3Si:NY_3$, wherein each R is independently selected from hydrogen, a halide selected from the group consisting of Cl, Br and I, a linear or branched C1-C10 alkyl group, a linear or branched C1-C10 alkoxy group, and/or a C6-C10 aryl group, and each Y is independently selected from hydrogen, a halide selected from the group consisting of Cl, Br and I, a linear or branched C1-C10 alkyl group, a linear or branched C1-C10 alkylsilyl group, and/or a C6-C10 aryl group, and wherein at least a portion of the silicon precursor absorbs onto the wafer surface. The wafer surface is heated to a temperature in the range of about 450° C. to about 650° C., so that the absorbed silicon precursor decomposes on the wafer surface to form a monolayer or sub-monolayer silicon film. The monolayer or sub-monolayer silicon film and wafer surface are exposed to a source of oxygen. The source of oxygen reacts with the monolayer or sub-monolayer silicon film to form a monolayer or sub-monolayer $SiO_2$ film.

Further embodiments of the disclosure are directed to methods of forming a highly stable $SiO_2$ film on a silicon wafer by ALD. At least one silicon wafer is placed into a susceptor within a reaction chamber. The at least one silicon wafer is heated to a temperature in the range of about 450° C. to about 650° C. A continuous stream of a silicon precursor is introduced into the reaction chamber through a showerhead. The silicon precursor comprises $R_3Si:NY_3$, wherein each R is independently selected from hydrogen, a halide selected from the group consisting of Cl, Br and I, a linear or branched C1-C10 alkyl group, a linear or branched C1-C10 alkoxy group, and/or a C6-C10 aryl group, and each Y is independently selected from hydrogen, a halide selected from the group consisting of Cl, Br and I, a linear or branched C1-C10 alkyl group, a linear or branched C1-C10 alkylsilyl group, and/or a C6-C10 aryl group. An oxygen plasma and/or an oxygen source gas is provided in at least one processing region of the reaction chamber. The susceptor is rotated so that the at least one silicon wafer passes beneath the showerhead. At least a portion of the silicon precursor absorbs onto a surface of the silicon wafer. The oxygen plasma and/or an oxygen source gas reacts with the absorbed silicon precursor to form a $SiO_2$ film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
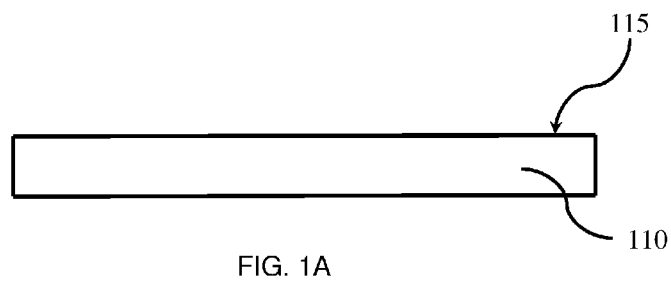
FIGS. 1A-1H illustrate an exemplary ALD deposition cycle for deposition of $SiO_2$.

Before describing several exemplary embodiments of the disclosure, it is to be understood that the disclosure is not limited to the details of construction or process steps set forth in the following description. The disclosure is capable of other embodiments and of being practiced or being carried out in various ways.

Reference throughout this specification to "one embodiment," "certain embodiments," "various embodiments," "one or more embodiments" or "an embodiment" means that a particular feature, structure, material, or characteristic described in connection with the embodiment may be included in at least one embodiment of the disclosure. Furthermore, the appearances of the phrases such as "in one or more embodiments," "in certain embodiments," "in one embodiment" or "in an embodiment" in various places throughout this specification are not necessarily referring to the same embodiment of the disclosure. In addition, the particular features, structures, materials, or characteristics described may be combined in any suitable manner in one or more embodiments.

As used herein, the term "conformal" refers to a layer that adheres to and uniformly covers exposed surfaces with a thickness having a variation of less than 1% relative to the average thickness of the film. For example, a 1,000 Å thick film would have less than 10 Å variation in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

As used in this specification and the appended claims, the terms "substrate" and "wafer" are used interchangeably, both referring to a thin piece of material having a surface, or portion of a surface, upon which a process acts. It will also be understood by those skilled in the art that reference to a substrate can also refer to only a portion of the substrate, unless the context clearly indicates otherwise. For example, in spatially separated ALD, described with respect to FIG. 4, each precursor is delivered to the substrate, but any individual precursor stream, at any given time, may only be delivered to a portion of the substrate. Additionally, reference to depositing on a substrate can mean both a bare substrate and a substrate with one or more films or features deposited or formed thereon.

In one or more embodiment, the Si precursor may be delivered to two or more deposition regions or processing regions within the processing chamber. In one or more embodiment, an oxygen plasma and/or oxygen source gas may be delivered to two or more processing regions, which are different from the Si precursor deposition regions. In various embodiments, the deposition regions may alternate spatially with processing regions, so a wafer may pass sequentially through a deposition region and then a processing region.

A "substrate surface" as used herein, refers to an exposed face of any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, silicon carbide, doped silicon, germanium, gallium arsenide, glass, sapphire, and any other materials such as metals, metal nitrides, metal carbides, metal alloys, and other conductive materials, depending on the application. Substrates include, without limitation, semiconductor and insulating wafers, which may or may not have been further processed to produce electronic and/or optoelectronic devices. Substrates may be exposed to a pretreatment process to clean, polish, etch, reduce, oxidize, hydroxylate, anneal and/or bake the substrate surface. In addition to film processing directly on the surface of the substrate itself, in the embodiments of the present disclosure any of the film processing steps disclosed may also be performed on an underlayer formed on the substrate as disclosed in more detail below, and the term "substrate surface" is predetermined to include such underlayer(s) as the context indicates, for example vias passing through thin semiconducting and/or insulating layers on an SOI wafer.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

Principles and embodiments of the present disclosure relate to depositing an $SiO_2$ film utilizing an aminosilane precursor that reacts with oxygen on a substrate surface.

In various embodiments the $SiO_2$ deposition is conducted within a substrate processing system comprising an ALD injector assembly positioned above and aligned with a susceptor assembly and/or wafer surface for continuous deposition to maximize throughput and improve processing efficiency and uniformity. The substrate processing system may also be configured and used for pre-deposition and post-deposition substrate treatments.

Embodiments of the disclosure are also related to methods for improving $SiO_2$ film quality and uniformity in an ALD processor.

Embodiments of the disclosure also comprise a showerhead spaced from the susceptor assembly/wafer in the vertical direction.

As used in this specification and the appended claims, the terms "reactive gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

Deposition of the $SiO_2$ film may be conducted in a processing chamber in accordance with one or more embodiments of the disclosure. The processing chamber is generally a sealable enclosure, which is operated under vacuum, or at least low pressure conditions. The system includes a gas distribution assembly capable of distributing one or more gases across the top surface of a substrate. The output face of the gas distribution assembly faces the top surface of the substrate.

The gas distribution assembly may comprise a plurality of gas ports to direct one or more gas streams at the substrate, and a plurality of vacuum ports disposed between each gas port to convey the gas out of the processing chamber. In the embodiment, the gas distribution assembly comprises a first precursor injector, a second precursor injector, and a purge gas injector between the first precursor injector and second precursor injector. The precursor injector injects a continuous (or pulse) stream of a reactive precursor of compound A into the processing chamber through a plurality of gas ports. The precursor injector injects a continuous (or pulse) stream of a reactive precursor of compound B into the processing chamber through a plurality of gas ports. The purge gas injector injects a continuous (or pulse) stream of a non-reactive or purge gas into the processing chamber through a plurality of gas ports. The purge gas removes reactive material and reactive by-products from the processing chamber. The purge gas is typically an inert gas, such as, nitrogen, argon and helium. Gas ports are disposed in between gas ports and gas ports so as to separate the precursor of compound A from the precursor of compound B, thereby avoiding cross-contamination between the precursors.

In various embodiments, the gas port may be a showerhead that disperses a gas over a region.

An aspect of the present disclosure relates to a method of depositing a film on a substrate surface, where the substrate is heated to a predetermined temperature. Heating a wafer or substrate surface to a predetermined temperature may be conducted within a reaction chamber, where the wafer may be heated by suitable means, for example heat lamps, or resistive heating of the susceptor.

One or more precursor gases may be heated using electrical resistive heating elements.

A gas distribution assembly may provide a continuous stream of a silicon precursor to the reaction chamber, wherein the stream of silicon precursor passes into at least one deposition region and contacts (or impinges on) at least a portion of a surface of the heated wafer for a predetermined period of time.

A substrate surface may be exposed to an oxygen plasma and/or an oxygen source gas in at least one processing region of the reaction chamber. Exposing at least a portion of the surface of the substrate surface upon which the silicon precursor impinged to the oxygen plasma and/or an oxygen source gas comprising ozone, wherein the oxygen plasma and/or ozone reacts with at least a portion of the silicon precursor on the surface of the heated wafer. In various embodiments, ozone may comprise in the range of 10% to 20% of the oxygen source gas, or in the range of 15% to 18% of the oxygen source gas, or 15% of the oxygen source gas, or 18% of the oxygen source gas.

In another aspect, a remote plasma source (not shown) may be connected to the precursor injector and the precursor injector prior to injecting the precursors into the processing chamber. The plasma of reactive oxygen species may be generated by applying an electric field to a compound within the remote plasma source. Any power source that is capable of activating the predetermined compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high energy light source (e.g., UV energy), or exposure to an x-ray source. Exemplary remote plasma sources are available from vendors such as MKS Instruments, Inc.® and Advanced Energy Industries, Inc.

FIGS. 1A-1H illustrate an exemplary ALD deposition cycle for deposition of $SiO_2$.

FIG. 1A illustrates a wafer or substrate 110 having at least one surface 115 that may be exposed to a flux of precursor molecules. In various embodiments, the silicon precursor molecules may be gaseous and directed towards an exposed surface 115 of the substrate 110 by a gas distribution assembly.

In various embodiments, the wafer or substrate may be placed in a susceptor that supports the substrate and transports the substrate between processing positions within a processing chamber. The susceptor may have a recess for receiving the substrate and keeping the substrate properly positioned as the susceptor moves. The susceptor may be heated so that the substrate may be heated to a predetermined temperature for processing.

In one or more embodiments, the substrate may be a semiconductor material substrate, where the semiconductor material may be silicon, strained silicon, silicon on insulator (SOI), doped silicon, silicon carbide, carbon doped silicon, silicon nitride, germanium, or gallium arsenide. In various embodiments, the substrate is a silicon wafer.

Figure 1B:
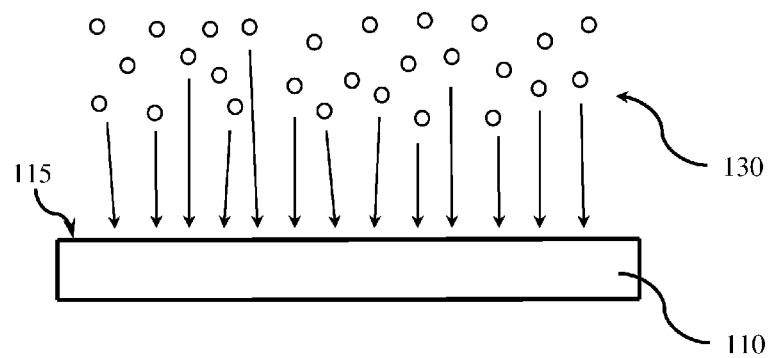

FIG. 1B illustrates a gaseous precursor directed toward on an exposed surface 115 of a substrate 110. In various embodiments, the exposed surface 115 may be referred to as a top surface of the substrate, particularly when the gas distribution assembly is positioned above the susceptor and substrates and the precursor is directed downward towards the surface. Conversely, if the gas distribution assembly is positioned below the susceptor and the gas flow directed upwards, the exposed surface would be a bottom surface.

In one or more embodiments, the wafer may be a silicon wafer supported by a susceptor that rotates, so that the wafer surface is exposed to a silicon precursor for a predetermined amount of time by passing beneath a showerhead. In various embodiments, the wafer surface is exposed to a silicon precursor by passing the silicon precursor through a shower head, and passing the wafer beneath the showerhead.

In one or more embodiments, the gaseous precursor 130 may be directed towards the surface 115 of the substrate 110 by an individual gas port of the gas distribution assembly. In various embodiments, the gaseous precursor 130 may be a gaseous silicon (Si) precursor delivered to the reaction chamber as a continuous stream or in pulses. A continuous stream of Si precursor may pass into at least one deposition region, where a deposition region is a portion of the reaction chamber in which the gaseous precursor 130 may be confined by one or more curtains of a purge gas and/or one or more vacuum ports that evacuate the gas(es) introduced to the reaction chamber. In various embodiments, the Si precursor contacts at least a portion of a surface of a heated wafer for a predetermined period of time. Stated differently, the substrate surface may be exposed to the Si precursor.

In one or more embodiments, the amount of Si precursor adsorbed onto the substrate surface may be controlled by adjusting the partial pressure of the Si precursor and/or the amount of time the substrate surface is exposed to the gaseous Si precursor. Lower partial pressures and/or shorter exposure times may be used to produce sub-monolayer coverage, or higher partial pressures and/or longer exposure times may be used to produce saturated (i.e., monolayer) coverage. Those skilled in the art will understand that 100% coverage of a surface may not be achieved, and monolayer coverage is predetermined to include the saturated coverage of a surface that may leave some open binding sites due to steric hindrance, steps, or other physical and/or chemical surface aspects that can interfere with binding of a precursor to a surface site.

In various embodiments, the precursor 130 conformally adsorbs onto the substrate surface 115.

In one or more embodiments, the Si precursor may be an aminosilane compound that can absorb onto the exposed surface of the substrate, and deposit a layer of silicon (Si) and/or $SiO_2$ onto the surface 115.

In one or more embodiments, the aminosilane compound has the formula $R_3Si:NY_3$, where each R may individually be hydrogen, a halogen selected from the group consisting of Cl, Br and I, a linear or branched $C_1$-$C_{10}$ alkyl group, a linear or branched $C_1$-$C_{10}$ alkoxy group, and/or a $C_6$-$C_{10}$ aryl group, and each Y may individually be a hydrogen, a halide selected from the group consisting of Cl, Br and I, a linear or branched $C_1$-$C_{10}$ alkyl group, a linear or branched $C_1$-$C_{10}$ alkylsilyl group, and/or a $C_6$-$C_{10}$ aryl group.

In one or more embodiments, each R may be a methyl group (—$CH_3$), and one or two of the Ys may be a linear or branched $C_1$-$C_{10}$ alkyl group, such that the aminosilane compound has the formula $R_3Si:L$, where L is a primary or secondary amine with the nitrogen bonded to the silicon.

In one or more embodiments, the aminosilane compound may be selected from the group consisting of N,N-dimethyltrimethylsilylamine (also referred to as (dimethylamine)trimethylsilane), N,N-diethyltrimethylsilylamine (also referred to as (diethylamine)trimethylsilane), N-methyl-1-(trimethylsilyl)methanamine (also referred to as (methylamine)trimethylsilane), and N-ethyl-1-(trimethylsilyl)methanamine (also referred to as (methylamine)trimethylsilane). In various embodiments, the aminosilane may also be, for example N,N-diethyl-1,1-dimethylsilylamine, or allyl(diethylamino)dimethylsilane.

In one or more embodiments, the silicon precursor may be a compound with the formula $Me_3Si:L$, where Me is a methyl group (—$CH_3$) and L is a primary or secondary amine, and the predetermined temperature of the wafer is in a range of about 400° C. to about 700° C. In various embodiments, the silicon precursor may be a compound with the formula $Me_3Si:L$, where Me is a methyl group (—$CH_3$) and L is a primary or secondary amine, and the predetermined temperature of the wafer is in a range of about 450° C. to about 650° C.

In one or more embodiments, each R may be a halogen separately selected from the group consisting of Cl, Br and I, and one or two of the Ys may be a linear or branched $C_1$-$C_{10}$ alkyl group, such that the aminosilane compound has the formula $R_3Si:L$, where L is a primary or secondary amine with the nitrogen bonded to the silicon.

In one or more embodiments, the aminosilane compound may be selected from the group consisting of N-methyl-N-trichlorosilylmethanamine (also referred to as N-(trichlorosilyl)dimethylamine), In one or more embodiments, the silicon precursor is a compound with the formula $X_3Si:L$, where X is a halogen selected from the group consisting of Cl, Br, I, and a combination thereof, L is a primary or secondary amine, and the predetermined temperature of the wafer is in a range of about 50° C. to about 700° C. In various embodiments, the silicon precursor is a compound with the formula $X_3Si:L$, where X is a halogen selected from the group consisting of Cl, Br, I, and a combination thereof, L is a primary or secondary amine, and the predetermined temperature of the wafer is in a range of about 80° C. to about 450° C.

In various embodiments, the silicon precursor may be heated to a temperature in the range of about 20° C. to about 200° C. to provide the continuous stream of the silicon precursor as a vapor to the reaction chamber.

Figure 1C:
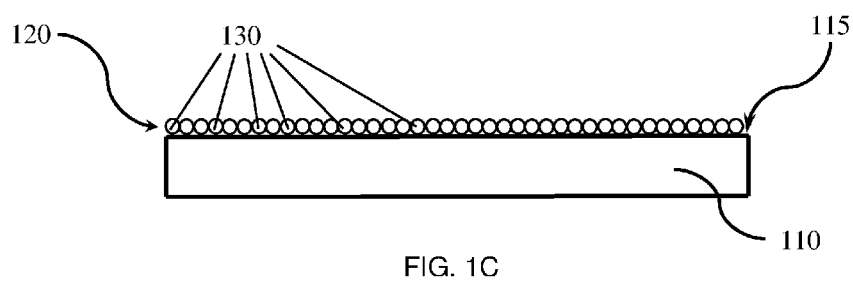

FIG. 1C illustrates a monolayer or sub-monolayer 120 of a precursor absorbed onto the exposed surface 115 of the substrate 110. In various embodiments, the precursor 130 may absorb onto the surface by chemisorption or physisorption. In ALD the precursor 130 may bond to surface sites in a self-limiting fashion, where additional precursor molecules do not adhere to the surface once the surface has become saturated with precursor molecules, such that all or at least a majority of the surface sites are occupied with a precursor.

In one or more embodiments, the substrate may be heated to a predetermined temperature for the precursor to react. In various embodiments, the substrate may be heated to a predetermined temperature in the range of about 50° C. to about 1000° C., or about 80° C. to about 900° C., or about 200° C. to about 800° C., or about 300° C. to about 750° C., or about 400° C. to about 700° C., or about 450° C. to about 650° C. In an embodiment, the substrate may be heated to a predetermined temperature of about 550° C.

Excess gaseous precursor that does not absorb on the substrate surface 115 may be removed by vacuum and/or purging with an unreactive gas.

Figure 1D:
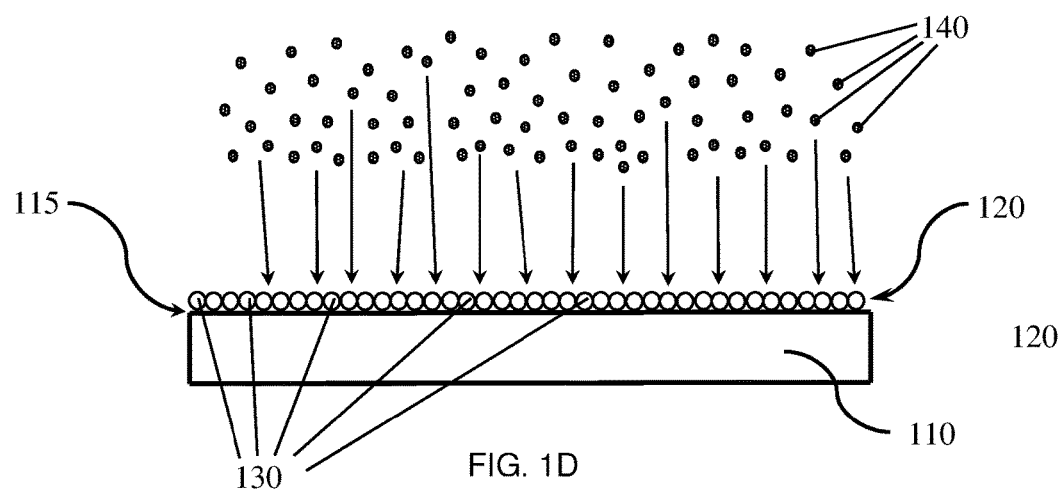

FIG. 1D illustrates an absorbed layer of precursor exposed to a reactant to form a layer of $SiO_2$. In one or more embodiments, the substrate surface or absorbed Si precursor 130 on the substrate surface is exposed to a reactant that can react with the Si to produce a layer of $SiO_2$. In some embodiments, the reactant can be an oxygen source 140. In one or more embodiments, the oxygen source 140 may be an oxygen plasma and/or a gas comprising ozone. In various embodiments, an oxygen source gas comprising ozone may also comprise molecular oxygen ($O_2$) and molecular nitrogen ($N_2$). In various embodiments, the oxygen plasma may be generated from an $O_2$ gas, or combination of $O_2$ and a gas selected from He, Ar, Ne, Kr, and combinations thereof.

In one or more embodiments, the oxygen plasma may be generated as a remote plasma, and the plasma species conveyed to the processing chamber to contact the substrate surface.

In one or more embodiments, the oxygen source comprises an oxygen plasma and/or ozone. In various embodiments, the ratio of ozone to deposited Si may be 1-to-1, or 2-to-1, or >2-to-1. A ratio of 1:1 means equal exposure time of the silicon precursor to ozone. A ratio of 2:1 means that the ozone exposure is twice as long as the silicon precursor. In a spatial ALD process, a 2:1 ratio means the deposited film is more oxidized because the ozone treatment of the film is longer.

In various embodiments, the oxygen source 140 contacts the surface 115 of the substrate that was previously covered with a sub-monolayer or monolayer 120 of Si precursor, where the substrate 110 and absorbed Si precursor 130 may be at a predetermined temperature. In various embodiments, the predetermined temperature may be in the range of about 400° C. to about 700° C., or in the range of about 450° C. to about 650° C., or in the range of about 80° C. to about 450° C.

In various embodiments, the oxygen source 140 comprises essentially no $H_2O$, where essentially no $H_2O$ means that no $H_2O$ is intentionally added to the oxygen source although small amounts of $H_2O$ may be present due to desorption or as minor contaminants of the materials comprising the oxygen source.

Figure 1E:
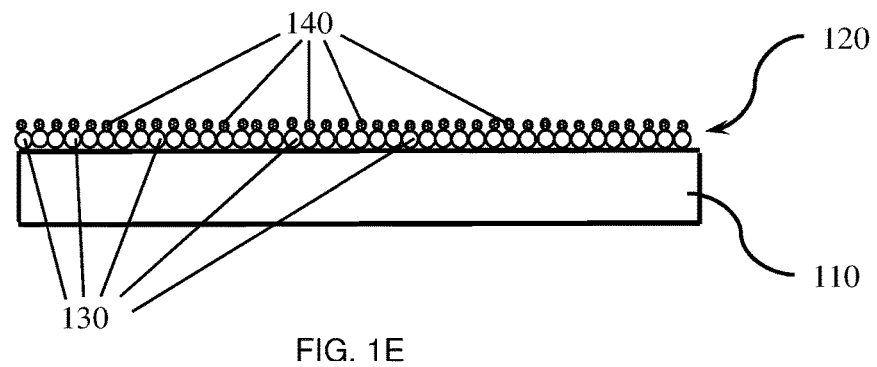

FIG. 1E illustrates a sub-monolayer or monolayer 120 of Si precursor interacting with the oxygen source 140 on the surface 115 of the substrate 110. In various embodiments, the oxygen source 140 may react directly with the absorbed Si precursor, as in the case of a plasma or oxygen ions and radicals, or an oxygen source gas may absorb onto the absorbed sub-monolayer or monolayer 120 of Si precursor and react to produce a $SiO_2$ film layer.

Figure 1F:
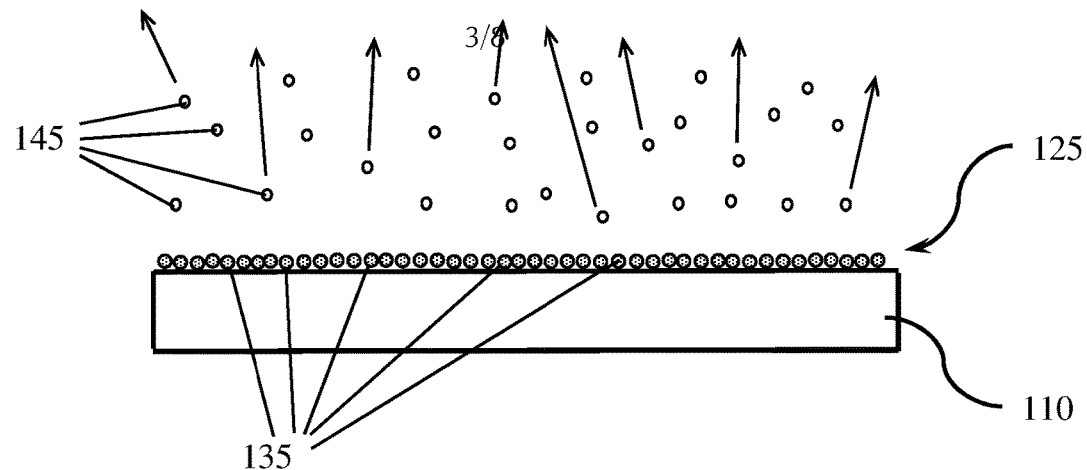

FIG. 1F illustrates reaction byproducts desorbing from the surface of the substrate. The byproducts may be evacuated from the reaction chamber by vacuum. In one or more embodiments, the organic and/or halogen moieties of the aminosilanes may separate from the silicon to form volatile reaction byproducts 145 that desorb from the surface 115 of the substrate leaving behind a deposited layer 125 of $SiO_2$ 135.

Figure 1G:
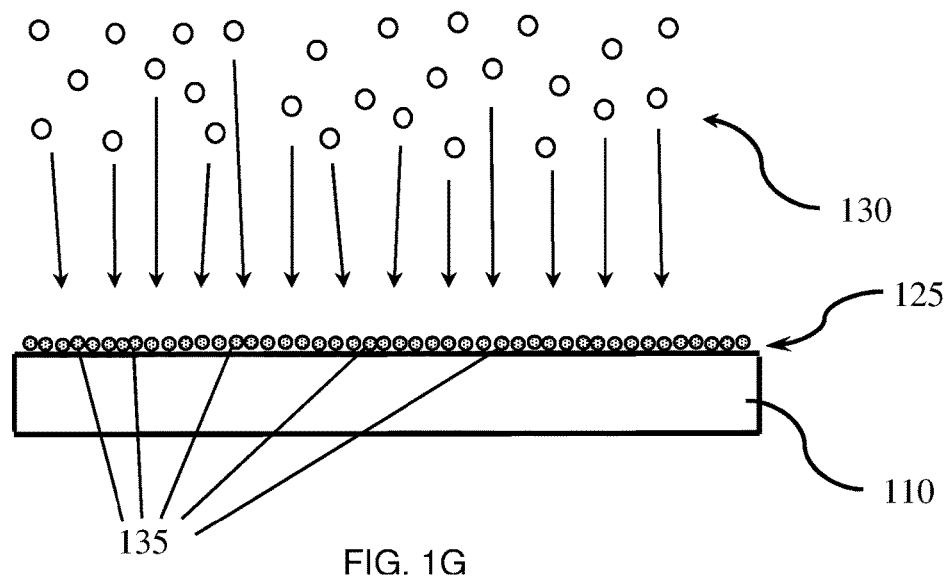

FIG. 1G illustrates an exemplary repeated exposure of the now deposited $SiO_2$ layer 125 on the surface 115 of the substrate 110 to another cycle of the Si precursor 130. The exposure of the exposed surface of the $SiO_2$ layer 125 to another dose of gaseous Si precursor 130 may form a monolayer or sub-monolayer film 120 of Si precursor 130 on the previously deposited $SiO_2$ 135.

Figure 1H:
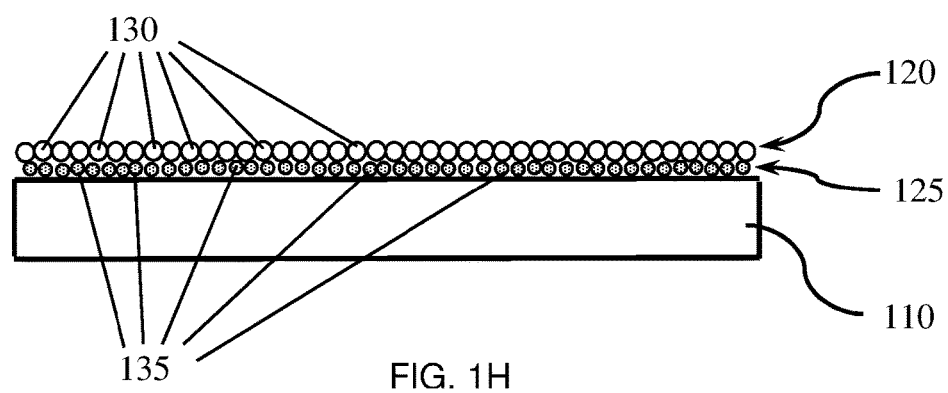

FIG. 1H illustrates an exemplary adsorption of a monolayer film 120 of the gaseous Si precursor 130 on the deposited $SiO_2$ monolayer 125. In a similar manner, the adsorbed Si precursor monolayer 120 may be subsequently exposed to another cycle of the oxygen source 140. This sequence may be repeated until a $SiO_2$ film of predetermined thickness is deposited on the substrate 110.

In one or more embodiments, the $SiO_2$ film forms conformally on a device feature. In some embodiments, the feature contains essentially no carbon or nitrogen contaminants. As used in this regard, essentially no contaminants means that there is less than about 2 atomic percent carbon or nitrogen in the feature. Sample $SiO_2$ films were grown by thermal oxidation and ALD. As shown in Table 1 below, the amount of carbon (C) and nitrogen (N) (in atomic percent) incorporated into the $SiO_2$ film was below detection by x-ray photoelectron spectroscopy (XPS). The results of the tests indicated that the ALD $SiO_2$ film is essentially pure without measurable C, N contents. The $SiO_2$ film grown by thermally oxidizing Si showed similar purity as $SiO_2$ deposited by ALD.

TABLE 1

| $SiO_2$ | Average composition (at. %) in bulk film | | | | |
|---|---|---|---|---|---|
| | C1s | N1s | O1s | Si2p | Si:O |
| ALD | 0.0 | 0.0 | 61.7 | 38.2 | 0.62 |
| Thermal oxide | 0.0 | 0.0 | 59.7 | 40.2 | 0.67 |

An aspect of the present disclosure relates generally to methods of depositing continuous, conformal $SiO_2$ layers on a substrate comprising exposing a substrate surface sequentially to a first Si precursor to produce a single layer of first Si precursor molecules bound to the substrate surface. The first Si precursor molecules bound to the substrate surface are exposed to a first oxygen source, where oxygen from the first oxygen source reacts with the first Si precursor molecules bound to the substrate surface. The sequential exposure of the substrate surface to the first Si precursor molecules and the first oxygen source can be repeated until a continuous, conformal, $SiO_2$ layer with a predetermined thickness is produced on the substrate surface.

Figure 2:
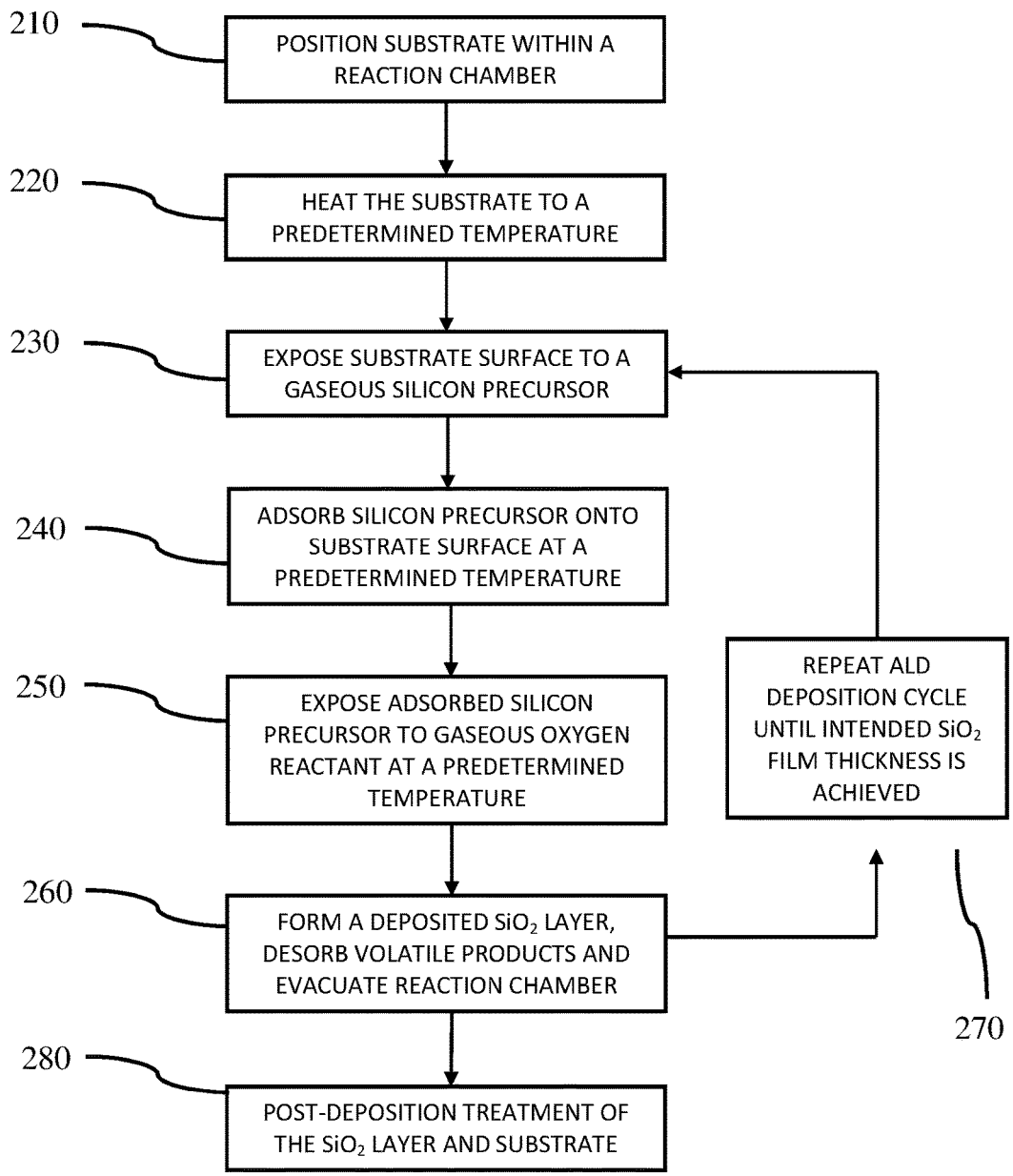
FIG. 2 illustrates a flowchart for an exemplary embodiment of a conformal $SiO_2$ layer ALD deposition process.

FIG. 2 illustrates a flow chart for an exemplary embodiment of a process for the deposition of continuous and conformal $SiO_2$ by ALD.

At 210 a substrate may be placed within a reaction chamber that is suitable for an ALD deposition process. The chamber may comprise an internal volume that may be sealed and evacuated by vacuum pumps, a susceptor for holding one or more wafers, and a gas distribution assembly for delivering the gaseous Si precursor and oxygen source to the reaction chamber and/or wafer surface. In various embodiments, the substrate may be a silicon wafer.

At 220 the substrate may be heated to a predetermined temperature at which the Si precursor will adsorb onto the substrate surface and react with the oxygen source to deposit the $SiO_2$ monolayer or sub-monolayer on the substrate surface. In various embodiments, the substrate may be heated to the predetermined temperature by any suitable heat source including, but not limited to, heat lamps and/or by conductive heating from the susceptor holding the substrate. Heating may be monitored by suitably located thermocouples and/or pyrometers that may be arranged externally, within the chamber, and/or operatively associated with the chamber components.

At 230 the Si precursor may be introduced into the reaction chamber, so that the substrate surface may be exposed to the gaseous Si precursor. The gaseous Si precursor may contact the substrate surface, and a portion absorb onto the surface.

In one or more embodiments, the Si precursor may be a liquid at standard ambient room temperature and pressure. In various embodiments, the liquid Si precursor may be contained in receptacle, for example an ampoule, such that the Si precursor may be heated to increase the volatilization and vapor pressure of the Si precursor, and generate a gaseous Si precursor that may be introduced into the reaction chamber. A carrier gas may be flowed through the ampoule to carry the precursor to the processing chamber.

In some embodiments, the Si precursor is a solid at standard ambient room temperature and pressure. The solid precursor may be contained in a receptacle, for example an ampoule, which can be heated to sublimate the precursor. A carrier gas can be flowed through the ampoule to carry the precursor to the processing chamber.

In some embodiments, a flow of gaseous Si precursor may be directed towards the substrate surface, for example by an ALD injector or showerhead, without filling the reaction chamber with the Si precursor. In various embodiments, the gaseous Si precursor may flow into a processing region which is separated from adjacent processing regions within the same processing chamber by a gas curtain.

In one or more embodiments, the silicon precursor comprises $R_3Si:NY_3$, wherein R is hydrogen, a halide selected from the group consisting of Cl, Br and I, a linear or branched $C_1$-$C_{10}$ alkyl group, a linear or branched $C_1$-$C_{10}$ alkoxy group, and/or a $C_6$-$C_{10}$ aryl group, and Y is a hydrogen, a halide selected from the group consisting of Cl, Br and I, a linear or branched $C_1$-$C_{10}$ alkyl group, a linear or branched $C_1$-$C_{10}$ alkylsilyl group, and/or a $C_6$-$C_{10}$ aryl group.

In one or more embodiments, the Si precursor may be reacted with an oxygen plasma and/or a gas comprising ozone.

At 240 the Si precursor may be adsorbed onto the substrate surface. In some embodiments, the adsorption process may be a physisorption interaction. In one or more embodiments, the adsorption process may be a chemisorption interaction. In various embodiments, the Si precursor may interact with the substrate surface at one or more binding sites and/or through, for example, dipole-dipole interactions. In various embodiments, the absorption may be by chemisorption where the Si precursor binds to sites on the substrate surface.

In one or more embodiments, the adsorption is self-limiting, such that a monolayer or sub-monolayer of the Si precursor forms on the substrate surface. In various embodiments, additional exposure to the gaseous Si precursor does not produce thicker layers of adsorbed Si precursor within the predetermined reaction temperature range.

At 250, an oxygen source may be introduced into the reaction chamber so that the substrate surface and/or film of adsorbed Si precursor may be exposed to the oxygen source. In various embodiments, the oxygen source may be directed towards the substrate surface, for example by an ALD injector, without filling the reaction chamber with the oxygen source. In various embodiments, the oxygen source may be evacuated through vacuum channel(s) before filling the reaction chamber and/or exposing portions of a substrate not under the injector delivery channel(s).

In one or more embodiments the Si precursor may be reacted with an oxygen plasma and/or a gas comprising ozone at a temperature in the range of about 400° C. to about 700° C. to form a deposited continuous and conformal $SiO_2$ layer on the substrate.

At 260, the Si precursor may be reacted with the oxygen source to deposit a continuous and conformal $SiO_2$ layer on the substrate surface. The deposited metal layer may be a monolayer or sub-monolayer thick with no detectable carbon or nitrogen incorporated into the $SiO_2$ layer. The reaction of the Si precursor with the oxygen source to deposit the $SiO_2$ layer on the substrate surface completes a cycle of the ALD exposure and reaction.

In various embodiments, an amine compound and/or one or more organic compounds may desorb from the substrate surface and/or deposited $SiO_2$ layer at the reaction temperature of the substrate. The desorbed compounds may be evacuated from the reaction chamber by vacuum.

In various embodiments, the $SiO_2$ layer formed on the substrate surface may conform to various surface features, including the sidewalls and bottom wall of one or more trenches formed in the substrate surface, and the sidewalls of one or more vias formed in the substrate surface, such that an essentially uniform monolayer or sub-monolayer of $SiO_2$ is deposited on all exposed substrate surfaces per cycle. Some features protrude from a substrate surface so that the feature has a top and two sides.

In one or more embodiments, the substrate surface may comprise one or more features with an aspect ratio in the range of about 10:1 to about 100:1, or about 20:1 to about 100:1, or about 10:1 to about 50:1, or about 20:1 to about 50:1, and the silicon precursor forms a conformal layer on the one or more features. In various embodiments, the surface features may be part of an electronic device.

In one or more embodiments, the surface features may have dimensions in the range of about 100 nm to about 3.5 µm, or about 100 nm to about 700 nm, or about 1 µm to about 3.5 µm. In various embodiments, the trench depth may be about 2 µm to about 3.5 µm, and the aspect ratio may be 50:1.

In one or more embodiments, the trench width may be about 10 nm to about 30 nm and the trench depth may be 100 nm to about 1000 nm. In various embodiments, the trench width may be about 50 nm to about 100 nm and the trench depth may be 1 µm to about 3.5 µm. In one or more embodiments, the one or more device features may be trenches having a trench depth in the range of about 1 um to about 3.5 um. In one or more embodiments, the one or more device features may be trenches having a trench depth in the range of about 100 nm to about 700 nm.

At 270, the cycle of introducing the Si precursor to expose the substrate surface and introducing the oxygen source to form additional $SiO_2$ layers on the substrate surface at the reaction temperature may be repeated one or more times to form a deposited $SiO_2$ layer of a predetermined thickness. In various embodiments, the exposure and deposition cycle may be repeated a sufficient number of times to form a $SiO_2$ layer with a thickness in the range of about 5 Å to about 300 Å. In various embodiments, the $SiO_2$ may deposit at a rate of about 0.8 to about 1.5 Å/sec.

At 280, a post-deposition treatment of the metal layer and/or substrate may be conducted. In one or more embodiments, the post-deposition treatment may comprise one or more of a UV cure, a thermal anneal, a post steam anneal, and/or a plasma treatment. In various embodiments, a UV cure may be conducted for a time in the range of about 1 minute (min) to about 6 min, using a broad band (200 nm-4000 nm) light source, wherein the UV cure densifies the deposited $SiO_2$ film layer, and decreases the wet etch rate ratio (WERR) in 1% HF from about 12.0 to about 6.4 relative to a thermally grown silicon oxide, as shown in Table 2. In various embodiments, the UV cure may be conducted in a temperature range of about 350° C. to about 450° C., or at about 400° C.

TABLE 2

| Condition | As Deposited | Post UV Cure |
| --- | --- | --- |
| Thickness (Å) | 450 | 427 |
| WERR | 12.0 | 6.4 |

In various embodiments, a thermal anneal (Rapid Thermal Processing—TRP) may be conducted at a temperature above the temperature of the substrate for a time in the range of about 30 seconds (sec) to about 150 sec, or about 120 sec. In various embodiments, the RTP may be conducted at about 1050° C. In various embodiments, the RTP may be conducted in an atmosphere of $N_2$ and/or $O_2$, where the RTP improves the film quality and decreases the wet etch rate ratio, for example from 9.9 to 5.1 for an $N_2$ RTP, or 9.8 to 6.5 for a 5% $O_2$ RTP.

In various embodiments, a post steam anneal may be conducted with a water concentration of about 10% to about 50% at a temperature of about 550° C. for about 30 min. The post steam anneal improves the film quality and decreases the wet etch rate ratio, for example from 8.8 to 6.5 for treatment at a temperature of about 550° C. for about 30 min.

Figure 3:
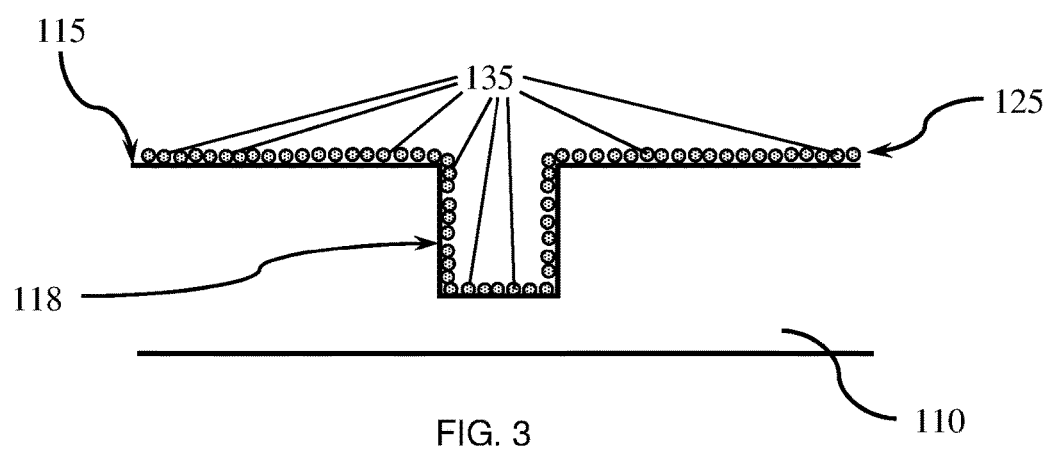
FIG. 3 illustrates an exemplary embodiment of the deposition of a conformal $SiO_2$ layer by ALD.

FIG. 3 illustrates a conformal $SiO_2$ layer 125 deposited by an ALD reaction between a Si precursor and an oxygen source over a surface feature 118, which may be a trench, via, or fabricated electronic structure, for example a FIN-FET.

Figure 4:
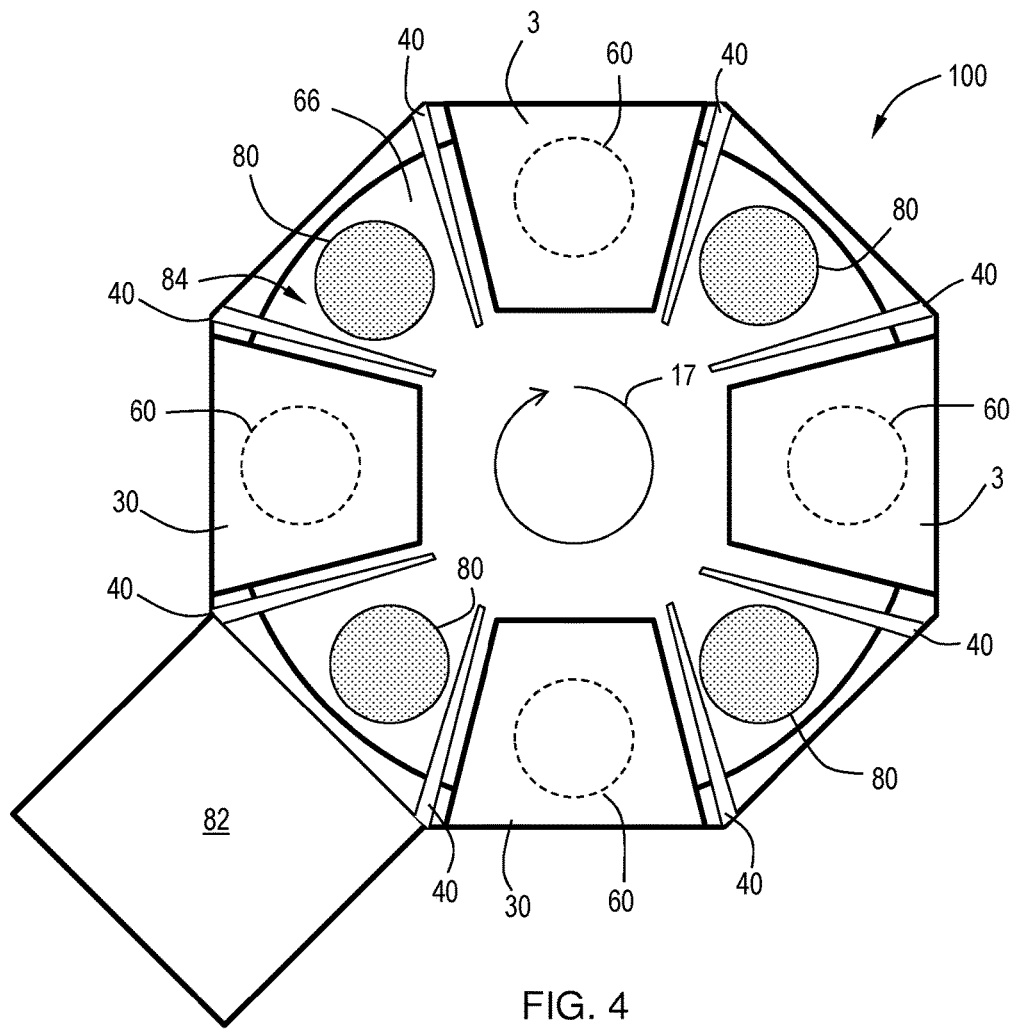
FIG. 4 is a schematic plan view of a substrate processing system configured with four gas distribution assembly units with a loading station in accordance with one or more embodiments of the disclosure.

FIG. 4 illustrates a portion of a processing chamber comprising multiple gas injectors used to process multiple wafers simultaneously so that the wafers experience the same process flow. For example, as shown in FIG. 4, the processing chamber 100 has four gas injector assemblies 30 and four wafers 60. At the outset of processing, the wafers 60 can be positioned between the injector assemblies 30. Rotating the susceptor 66 of the carousel by 45° will result in each wafer 60 being moved to an injector assembly 30 for film deposition. This is the position shown in FIG. 4. An additional 45° rotation would move the wafers 60 away from the injector assemblies 30. With spatial ALD injectors, a film is deposited on the wafer during movement of the wafer relative to the injector assembly. In some embodiments, the susceptor 66 is rotated so that the wafers 60 do not stop beneath the injector assemblies 30. The number of wafers 60 and gas distribution assemblies 30 can be the same or different.

In one or more embodiments, the system 100 further includes a pumping system connected to the processing chamber. The pumping system is generally configured to evacuate the gas streams out of the processing chamber through one or more vacuum ports. The vacuum ports are disposed between each gas port so as to evacuate the gas streams out of the processing chamber after the gas streams react with the substrate surface and to further limit cross-contamination between the precursors.

Atomic layer deposition systems of this sort (i.e., where multiple gases are separately flowed toward the substrate at the same time) are referred to as spatial ALD. In operation, a substrate 60 is delivered (e.g., by a robot) to the processing chamber and can be placed on a susceptor before or after entry into the processing chamber. The susceptor moves through the processing chamber, passing beneath (or above) the gas distribution assembly 30. In the embodiment shown in FIG. 4, the susceptor moves in a circular path through a carousel processing system.

Processing chambers having multiple gas injectors can be used to process multiple wafers simultaneously so that the wafers experience the same process flow. For example, as shown in FIG. 4, the processing chamber 100 has four gas injector assemblies 30 and four wafers 60. At the outset of processing, the wafers 60 can be positioned between the injector assemblies 30. Rotating the susceptor 66 of the carousel by 45° will result in each wafer 60 being moved to an injector assembly 30 for film deposition. This is the position shown in FIG. 4. An additional 45° rotation would move the wafers 60 away from the injector assemblies 30. With spatial ALD injectors, a film is deposited on the wafer during movement of the wafer relative to the injector assembly. In some embodiments, the susceptor 66 is rotated so that the wafers 60 do not stop beneath the injector assemblies 30. The number of wafers 60 and gas distribution assemblies 30 can be the same or different. In some embodiments, there are the same number of wafers being processed as there are gas distribution assemblies. In one or more embodiments, the number of wafers being processed are an integer multiple of the number of gas distribution assemblies. For example, if there are four gas distribution assemblies, there are 4× wafers being processed, where x is an integer value greater than or equal to one.

The processing chamber 100 shown in FIG. 4 is merely representative of one possible configuration and should not be taken as limiting the scope of the disclosure. Here, the processing chamber 100 includes a plurality of gas distribution assemblies 30. In the embodiment shown, there are four gas distribution assemblies 30 evenly spaced about the processing chamber 100. The processing chamber 100 shown is octagonal, however, it will be understood by those skilled in the art that this is one possible shape and should not be taken as limiting the scope of the disclosure.

The processing chamber 100 includes a substrate support apparatus, shown as a round susceptor 66 or susceptor assembly. The substrate support apparatus, or susceptor 66, is capable of moving a plurality of substrates 60 beneath each of the gas distribution assemblies 30. A load lock 82 might be connected to a side of the processing chamber 100 to allow the substrates 60 to be loaded/unloaded from the chamber 100.

The processing chamber 100 may include a plurality, or set, of first treatment stations 80 positioned between any or each of the plurality of gas distribution assemblies 30. In some embodiments, each of the first treatment stations 80 provides the same treatment to a substrate 60.

The number of treatment stations and the number of different types of treatment stations can vary depending on the process. For example, there can be one, two, three, four, five, six, seven or more treatment stations positioned between the gas distribution assemblies 30. Each treatment stations can independently provide a different treatment from every other set of treatments station, or there can be a mixture of the same type and different types of treatments. In some embodiments, one or more of the individual treatments stations provides a different treatment than one or more of the other individual treatment stations.

The extent to which the substrate surface 115 is exposed to each gas may be determined by, for example, the flow rates of each gas coming out of the gas port and the rate of movement of the substrate 60. In one embodiment, the flow rates of each gas are controlled so as not to remove adsorbed precursors from the substrate surface 61. The width between each partition, the number of gas ports disposed on the processing chamber 100, and the number of times the substrate is passed across the gas distribution assembly may also determine the extent to which the substrate surface 61 is exposed to the various gases. Consequently, the quantity and quality of a deposited film may be optimized by varying the above-referenced factors.

Although description of the process has been made with the gas distribution assembly directing a flow of gas downward toward a substrate positioned below the gas distribution assembly, it will be understood that this orientation can be different. In some embodiments, the gas distribution assembly directs a flow of gas upward toward a substrate surface. As used in this specification and the appended claims, the term "passed across" means that the substrate has been moved from one side of the gas distribution assembly to the other side so that the entire surface of the substrate is exposed to each gas stream from the gas distribution plate. Absent additional description, the term "passed across" does not imply any particular orientation of gas distribution assemblies, gas flows or substrate positions.

In some embodiments, the susceptor for carrying the substrate is a carrier which helps to form a uniform temperature across the substrate, and may rotate so the substrate moves in a circular path. The susceptor has a top surface for carrying the substrate. The susceptor may be a heated susceptor so that the substrate may be heated for processing. As an example, the susceptor 66 may be heated by radiant heat lamps, a heating plate, resistive coils, or other heating devices, disposed underneath the susceptor.

In still another embodiment, the top surface of the susceptor includes a recess to accept the substrate. The susceptor is generally thicker than the thickness of the substrate so that there is susceptor material beneath the substrate. In some embodiments, the recess is sized such that when the substrate is disposed inside the recess, the first surface of substrate is level with, or substantially coplanar with, the top surface of the susceptor. Stated differently, the recess of some embodiments is sized such that when a substrate 60 is disposed therein, the first surface of the substrate 60 does not protrude above the top surface of the susceptor. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

In some embodiments, the processing chamber comprises a plurality of gas curtains 40. Each gas curtain 40 creates a barrier to prevent, or minimize, the movement of processing gases from the gas distribution assemblies 30 from migrating from the gas distribution assembly regions and gases from the treatment stations 80 from migrating from the treatment station regions. The gas curtain 40 can include any suitable combination of gas and vacuum streams which can isolate the individual processing sections from the adjacent sections. In some embodiments, the gas curtain 40 is a purge (or inert) gas stream. In one or more embodiments, the gas curtain 40 is a vacuum stream that removes gases from the processing chamber. In some embodiments, the gas curtain 40 is a combination of purge gas and vacuum streams so that there are, in order, a purge gas stream, a vacuum stream and a purge gas stream. In one or more embodiments, the gas curtain 40 is a combination of vacuum streams and purge gas streams so that there are, in order, a vacuum stream, a purge gas stream and a vacuum stream. The gas curtains 40 shown in FIG. 4 are positioned between each of the gas distribution assemblies 30 and treatment stations 80, but it will be understood that the curtains can be positioned at any point or points along the processing path.

Figure 5:
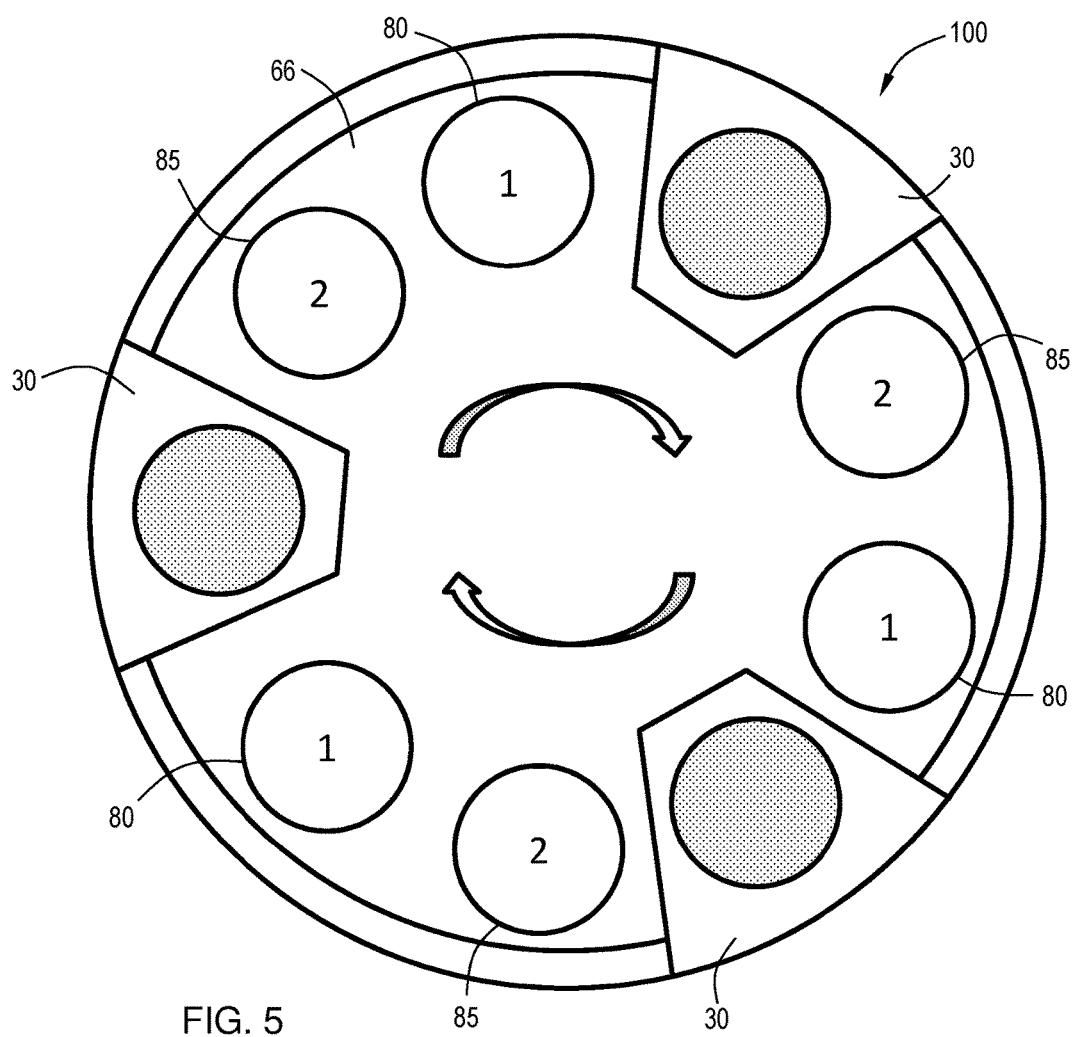
FIG. 5 is a schematic plan view of a substrate processing system configured with three gas distribution assembly units.

In the embodiment shown in FIG. 5, a set of second treatment stations 85 are positioned between the first treatment stations 80 and the gas distribution assemblies 30 so that a substrate 60 rotated through the processing chamber 100 would encounter, depending on where the substrate 60 starts, a gas distribution assembly 30, a first treatment station 80 and a second treatment station 85 before encountering a second of any of these. For example, as shown in FIG. 5, if the substrate started at the first treatment station 80, it would see, in order, the first treatment station 80, a gas distribution assembly 30 and a second treatment station 85 before encountering a second first treatment station 85. In various embodiments, the treatment stations 85 may be adapted to perform the post deposition treatments, as described herein.

Treatment stations can provide any suitable type of treatment to the substrate, film on the substrate or susceptor assembly. For example, UV lamps, flash lamps, plasma sources and heaters. The wafers are then moved between positions with the gas distribution assemblies 30 to a position with, for example, a showerhead delivering plasma to the wafer. The plasma station being referred to as a treatment station 80. In one or more example, silicon nitride films can be formed with plasma treatment after each deposition layer. As the ALD reaction is, theoretically, self-limiting as long as the surface is saturated, additional exposure to the deposition gas will not cause damage to the film.

Figure 6:
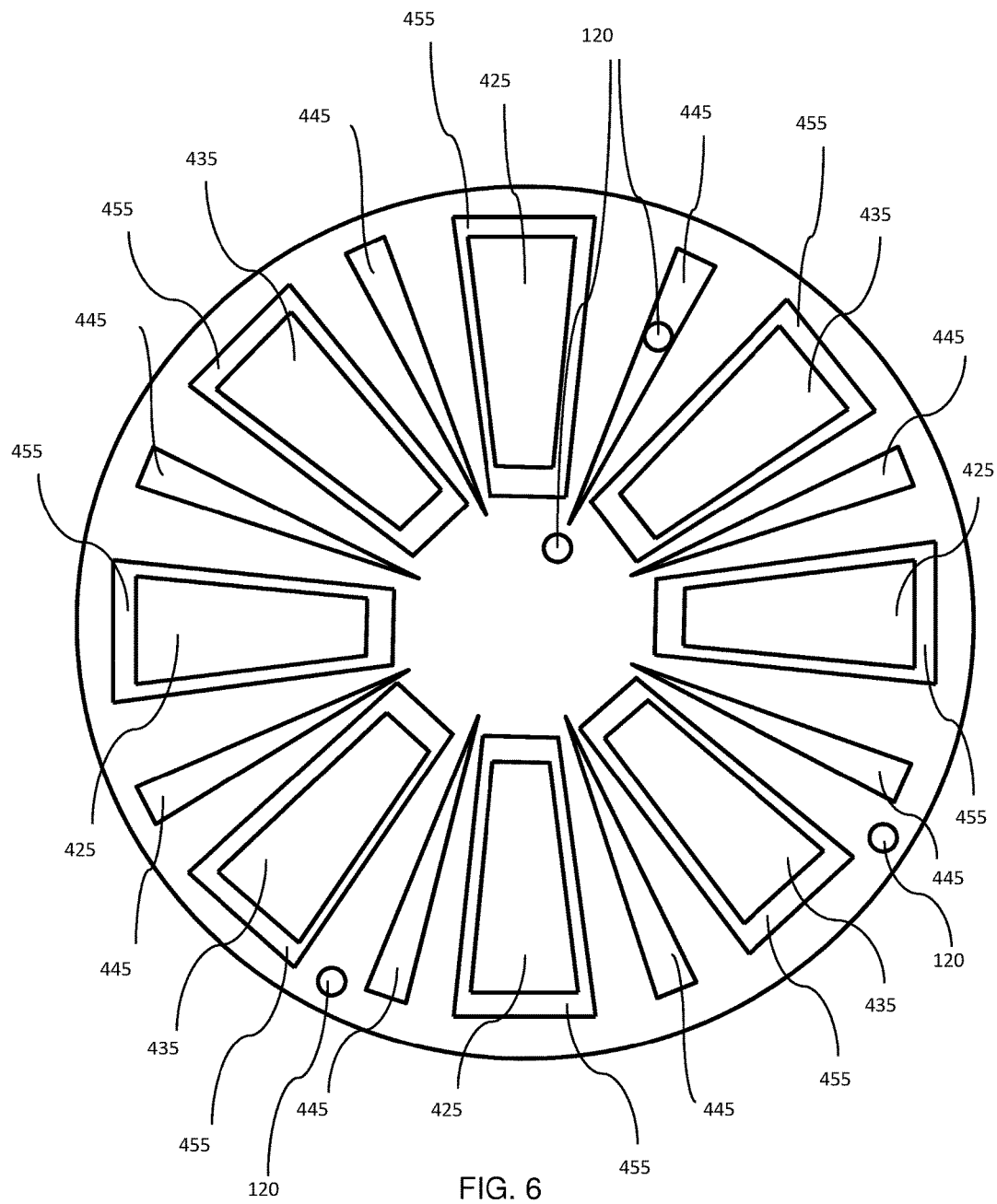
FIG. 6 illustrates an exemplary embodiment of a circular gas distribution assembly.

FIG. 6 illustrates an exemplary embodiment of a circular gas distribution assembly.

As the substrate moves around the processing chamber, the top surface of the substrate facing the ports is repeatedly exposed to the reactive gas A (Si precursor) coming from gas ports 425 and reactive gas B (oxygen source) coming from gas ports 435, with the purge gas coming from gas ports 445 in between. Injection of the purge gas is designed to reduce or prevent comingling of the precursors and assist in removing unreacted material from the previous exposure to a precursor prior to exposing the substrate surface to the next precursor. After each exposure to the various gas streams (e.g., the reactive gases or the purge gas), the gas streams are evacuated through vacuum ports 455 by a pumping system. Since a vacuum port may be disposed on both sides of each gas port, the gas streams are evacuated through the vacuum ports 455 on both sides. Thus, the gas streams flow from the respective gas ports vertically downward toward the first surface of the substrate 60, across the substrate surface 110 and finally upward toward the vacuum ports 455. In this manner, each gas may be uniformly distributed across the substrate surface 110. Substrate 60 may also be rotated while being exposed to the various gas streams. Rotation of the substrate may be useful in preventing the formation of strips in the formed layers. Rotation of the substrate can be continuous or in discrete steps and can occur while the substrate is passing beneath the gas distribution assembly 30 or when the substrate is in a region before and/or after the gas distribution assembly 30.

A susceptor assembly is positioned within the processing chamber to rotate at least one substrate in a substantially circular path about a rotational axis. As used in this specification and the appended claims, the term "substantially circular" means that the path is predetermined to be circular if the substrate were to complete a full rotation. The susceptor assembly has a top surface defined by an inner peripheral edge and an outer peripheral edge. The susceptor assembly is positioned below the gas distribution assembly so that the top surface of the susceptor assembly faces the front face of the gas distribution assembly.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma source.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:
1. A method of depositing a film, the method comprising:
exposing a wafer surface to a silicon precursor that adsorbs onto the wafer surface, the silicon precursor comprising $R_3Si:NY_3$, wherein each R is independently selected from hydrogen, Cl, Br, I, a linear or branched $C_1$-$C_{10}$ alkyl group, a linear or branched $C_1$-$C_{10}$ alkoxy group, and a $C_6$-$C_{10}$ aryl group, and each Y is independently selected from the group consisting of Cl, Br, I, a linear or branched $C_1$-$C_{10}$ alkylsilyl group, and a $C_6$-$C_{10}$ aryl group;
heating the wafer surface to a temperature in the range of about 450° C. to about 650° C. to decompose the adsorbed silicon precursor on the wafer surface to form a monolayer or sub-monolayer silicon film; and
exposing the monolayer or sub-monolayer silicon film and wafer surface to an oxygen source, wherein the oxygen source reacts with the monolayer or sub-monolayer silicon film to form a monolayer or sub-monolayer $SiO_2$ film.

2. The method of claim 1, wherein exposing the wafer surface to a silicon precursor comprises passing the silicon precursor through a shower head, and passing the wafer beneath the showerhead.

3. The method of claim 2, wherein the wafer is a silicon wafer, and the silicon wafer is supported by a susceptor that rotates, so the wafer surface is exposed to the silicon precursor for a predetermined amount of time by passing beneath the showerhead.

4. The method of claim 1, wherein the source of oxygen is an oxygen plasma and/or a gas comprising ozone.

5. The method of claim 4, wherein the source of oxygen is the oxygen plasma in combination with the gas comprising ozone.

6. The method of claim 1, wherein the wafer surface comprises one or more device features with an aspect ratio in the range of about 10:1 to about 100:1, and the silicon precursor forms a conformal layer on the one or more device features.

7. The method of claim 6, wherein the one or more device features are trenches having a trench depth in the range of about 1 µm to about 3.5 µm.

8. The method of claim 6, wherein the one or more device features are trenches having a trench depth in the range of about 100 nm to about 700 nm.

9. The method of claim 6, wherein the monolayer or sub-monolayer $SiO_2$ film formed conformally on the device features contains essentially no carbon or nitrogen contaminants.

10. A method of depositing a film, the method comprising:
placing at least one silicon wafer into a susceptor within a reaction chamber;
heating the at least one silicon wafer to a temperature in the range of about 450° C. to about 650° C.;
introducing a continuous stream of a silicon precursor into the reaction chamber through a showerhead, the silicon precursor comprising $R_3Si:NY_3$, wherein each R is independently selected from hydrogen, Cl, Br, I, a linear or branched $C_1$-$C_{10}$ alkyl group, a linear or branched $C_1$-$C_{10}$ alkoxy group, and a $C_6$-$C_{10}$ aryl group, and each Y is independently selected from the group consisting of Cl, Br, I, a linear or branched $C_1$-$C_{10}$ alkylsilyl group, and a $C_6$-$C_{10}$ aryl group;
providing a source of oxygen comprising one or more of an oxygen plasma or an oxygen source gas in at least one processing region of the reaction chamber;
rotating the susceptor, so the at least one silicon wafer passes beneath the showerhead, wherein at least a portion of the silicon precursor adsorbs onto a surface of the silicon wafer, and the one or more of oxygen plasma or oxygen source gas reacts with the absorbed silicon precursor to form a $SiO_2$ film.

11. The method of claim 10, further comprising treating the $SiO_2$ film with a post deposition treatment comprising one or more of a UV cure, a thermal anneal, a post steam anneal, and/or a plasma treatment.

12. The method of claim 10, wherein the source of oxygen comprises an oxygen plasma and ozone.

13. The method of claim 10, wherein the wafer surface comprises one or more device features with an aspect ratio in the range of about 10:1 to about 100:1, and the silicon precursor forms a conformal layer on the one or more device features.

14. The method of claim 13, wherein the one or more device features are trenches having a trench depth in the range of about 1 µm to about 3.5 µm.

15. The method of claim 13, wherein the one or more device features are trenches having a trench depth in the range of about 100 nm to about 700 nm.

16. The method of claim 13, wherein the monolayer or sub-monolayer $SiO_2$ film formed conformally on the device features contains essentially no carbon or nitrogen contaminants.

\* \* \* \* \*